(12) United States Patent
Balucani

(10) Patent No.: US 7,892,954 B2
(45) Date of Patent: Feb. 22, 2011

(54) INTERCONNECTION OF ELECTRONIC DEVICES WITH RAISED LEADS

(76) Inventor: Marco Balucani, Rise Technology S.r.l. Via Orazio 8/B 00040, Pomezia (RM) (IT)

( * ) Notice: Subject to any disclaimer, the term of this patent is extended or adjusted under 35 U.S.C. 154(b) by 205 days.

(21) Appl. No.: 12/293,273

(22) PCT Filed: Mar. 16, 2007

(86) PCT No.: PCT/EP2007/052497
§ 371 (c)(1),
(2), (4) Date: Jan. 23, 2009

(87) PCT Pub. No.: WO2007/104799
PCT Pub. Date: Sep. 20, 2007

(65) Prior Publication Data
US 2009/0309098 A1    Dec. 17, 2009

(30) Foreign Application Priority Data
Mar. 16, 2006   (IT) ................. MI2006A0478

(51) Int. Cl.
*H01L 21/00* (2006.01)
(52) U.S. Cl. .............. 438/487; 257/E21.511
(58) Field of Classification Search ........ 438/482, 438/486, 487; 257/E21.57, E21.511
See application file for complete search history.

(56) References Cited

U.S. PATENT DOCUMENTS 3,795,037 A    3/1974  Luttmer
5,763,941 A *  6/1998  Fjelstad ............... 257/669
6,307,260 B1 * 10/2001 Smith et al. ........... 257/696
6,405,429 B1   6/2002  Slemmons et al.
2001/0039103 A1 11/2001 Muramatsu et al.
2002/0031905 A1  3/2002 Beroz
2002/0145182 A1 10/2002 Smith et al.

FOREIGN PATENT DOCUMENTS

EP     0352020    1/1990
EP     0870325   10/1998
WO     02/073683  9/2002

OTHER PUBLICATIONS

P.N. Vinod, "Specific contact resistance of the porous silicon and silver metal Ohmic contact structure", Semiconductor Sci. Technol. 16, 966-971 (2005).*
International Preliminary Report on Patentability, PCTIEP20071052497 Sep. 16, 2008.*
International Search Report for International Patent Application Serial No. PCT/EP2007/052497; European Patent Office, Jul. 2, 2007.

* cited by examiner

*Primary Examiner*—Thomas L Dickey
(74) *Attorney, Agent, or Firm*—Bryan A. Santarelli; Graybeal Jackson LLP

(57) ABSTRACT

An embodiment of a process of manufacturing an interconnection element for contacting electronic devices is proposed. The process starts with the step of forming a plurality of leads on a main surface of a first substrate; each lead has a first end and a second end. The second end of each lead is coupled with a second substrate. The second substrate and the first substrate are then spaced apart, so as to extend the leads between the first substrate and the second substrate. The process also includes the step of treating the main surface before forming the leads to control an adhesion of the leads on the main surface.

24 Claims, 8 Drawing Sheets

INTERCONNECTION OF ELECTRONIC DEVICES WITH RAISED LEADS

PRIORITY CLAIM

The present application is a national phase application filed pursuant to 35 USC §371 of International Patent Application Serial No. PCT/EP2007/052497, filed Mar. 16, 2007; which further claims the benefit of Italian Patent Application MI2006A000478, filed Mar. 16, 2006; all of the foregoing applications are incorporated herein by reference in their entireties.

TECHNICAL FIELD

An embodiment of the present invention generally relates to the electronics field. More specifically, an embodiment of the present invention relates to the interconnection of electronic devices.

BACKGROUND

Electronic devices are generally interconnected to each other, in order to accomplish a number of tasks. An example is that of a Multi-Chip Module (MCM), wherein a plurality of circuits integrated in corresponding chips of semiconductor materials are packaged in a single electronic assembly. Another example is that of a probe card, which is used to contact integrated circuits at a wafer level for their test.

Several solutions have been proposed to achieve the desired result. Particularly, a specific technique known in the art is based on the raising of flexible leads.

For example, EP-A-0352020, which is incorporated by reference discloses a system for interconnecting multiple chips by means of a semiconductor carrier. For this purpose, conductive pads of each chip are connected to corresponding textured portions of conductive pads provided on the carrier (facing to each other). In order to increase the mechanical compliance of the structure so obtained, EP-A-0352020 teaches to arrange a localized layer of insulating material between each chip and a portion of its pads; the insulating material is selected so as to have relatively little or no adhesion with the chip pads. The chip is pressed against the carrier, thereby connecting the portions of the chip pads resting on the insulating material to the corresponding carrier pads; the chip is then slightly pulled up to space it apart from the carrier (for example, by 2 mm). In this way, the chip pads detach from the insulating layer, thereby extending them between the chip and the carrier (with the insulating material that can also be removed at the end). The structure proposed in EP-A-0352020 allows withstanding strains caused by mechanical or thermal stresses.

A variation of the same technique is proposed in EP-A-0870325, which is incorporated by reference. In this case, a removable layer is exploited to facilitate the raising of the leads. More specifically, the leads are formed over a multi-layer sheet (consisting of a dielectric sheet sandwiched between two metal layers); each lead is shaped as a strip, which extends between a tip end and a terminal end. The metal layer under the leads is then etched, so as to separate the strips from the dielectric sheet. The tip end of each lead is instead slightly larger than its strip, so that the etching process leaves a small button under it; this button provides a very small adhesion of the tip end to the dielectric layer (just strong enough to retain the tip end against gravitational and acceleration forces in normal handling). On the other hand, the terminal end of each lead is far larger, so that the same etching process leaves a bigger button under it; this button firmly secures the terminal end to the multi-layer sheet (at the same time connecting the lead—through a via-hole—to a corresponding terminal being formed on its opposed surface). The component so obtained is aligned with a wafer, and the tip ends are bonded to corresponding contacts of the wafer. As above, the multi-layer sheet and the wafer are spaced apart, so as to extend the leads among them (with the tip ends of the leads that readily detach from the multi-layer sheet).

In any case, the leads used in interconnection elements are generally protected by a dielectric material (preferably of the elastic type). For example, U.S. Pat. No. 3,795,037, which is incorporated by reference discloses a connector with resilient leads, which are embedded in an elastomeric material; the structure so obtained allows connecting electronic devices, without requiring any accurate control of the eight of the leads. The connector is produced by defining the leads in a series of frames (for example, by chemical milling). A stack formed by multiple frames with interposed spacers is then build up, and clamped between two plates. At this point, an elastomeric liquid is injected into the cavity defined by the plates, and it is cured; at the end, the plates are removed so as to obtain the desired structure.

The same technique is also applied in the above-mentioned document EP-A-0870325. In this case (after the leads have been extended), a flowable material is injected between the multi-layer sheet and the wafer—to fill the available space and to penetrate among all the leads. As above, the material is then cured so as to embed the leads in an elastic dielectric layer.

However, the solutions known in the art may not be completely satisfactory. Indeed, these techniques are relatively complex; for example, they require the use of sacrifical layers that adversely affect the corresponding manufacturing processes.

Moreover, it may be very difficult to obtain an acceptable level of quality. For example, in the structure disclosed in EP-A-0352020 the chip pads may easily detach from the insulating material (before their connection to the carrier). On the other hand, a very high accuracy is typically required in EP-A-0870325 to obtain the correct size of the buttons under the tip ends; indeed, the corresponding manufacturing process must typically be perfectly controlled to ensure that the tip ends are retained by the multi-layer sheet (before their connection to the wafer), but at the same time they readily detach when the leads must be extended.

SUMMARY

In its general terms, the present disclosure is based on the idea of treating a substrate wherein the leads are formed.

More specifically, an embodiment of the invention proposes a process of manufacturing an interconnection element (for contacting electronic devices). The process starts with the step of forming a plurality of leads on a main surface of a first substrate; each lead has a first end and a second end. The second end of each lead is coupled with a second substrate. The second substrate and the first substrate are then spaced apart, so as to extend the leads between the first substrate and the second substrate. The process also includes the step of treating the main surface before forming the leads to control an adhesion of the leads on the main surface.

In an embodiment of the invention, this result is achieved by means of one or more adhesion promoting regions on the main surface.

These adhesion promoting regions may be made of porous silicon.

A way to further improve the embodiment is of decreasing the porosity of the porous silicon regions moving away from the main surface.

A suggested range of the porosity is also proposed.

This result may be achieved by decreasing a current density of a corresponding anodic process over time.

A range of the current density is also suggested.

In a specific implementation, the adhesion promoting regions are formed selectively in each contact area between a corresponding lead and the main surface.

A way to further improve the embodiment is of decreasing the adhesion moving from the first end to the second end of each lead.

A suggested range of this variation is also proposed.

Particularly, the desired result may be achieved by reducing a concentration of the adhesion promoting regions.

Optionally, it is possible to deposit a metal layer on the porous silicon regions.

Typically, a flowable insulating material is injected between the two substrates and then cured, so as to obtain a corresponding insulating layer embedding the leads.

In an embodiment of the invention, the first ends of the leads are formed in corresponding grooves of the first substrate.

Advantageously, the leads may be made with a hard material in the grooves and with a ductile material elsewhere.

A suggested quantitative definition of these materials is also proposed.

Typically, the first substrate is then removed.

For this purpose, it is possible to exploit a wet etching process until a stop layer is reached, then followed by a dry etching process.

In a particular embodiment of the invention, a portion of the insulating layer between the two substrates is removed.

A suggested range of the amount of insulating layer to be removed is also proposed.

The second substrate may also be removed at the end of the manufacturing process.

Another embodiment of the invention proposes a process of manufacturing an electronic assembly based on this interconnection element.

A further embodiment of the invention proposes a process of manufacturing a test card, based on the same interconnection element.

A different embodiment of the invention proposes a corresponding interconnection element.

Another embodiment of the invention proposes a corresponding electronic assembly.

A further embodiment of the invention proposes a corresponding test card.

BRIEF DESCRIPTION OF THE DRAWINGS

One or more embodiments of the invention, as well as further features and the advantages thereof, will be best understood with reference to the following detailed description, given purely by way of a non-restrictive indication, to be read in conjunction with the accompanying drawings. In this respect, it is expressly intended that the figures are not necessary drawn to scale and that, unless otherwise indicated, they are merely intended to conceptually illustrate the structures and procedures described herein. Particularly.

DETAILED DESCRIPTION

With reference now to FIGS. 1a-1g, the various phases of a process for manufacturing an interconnection element according to different embodiments of the invention are illustrated.

Figure 1A:
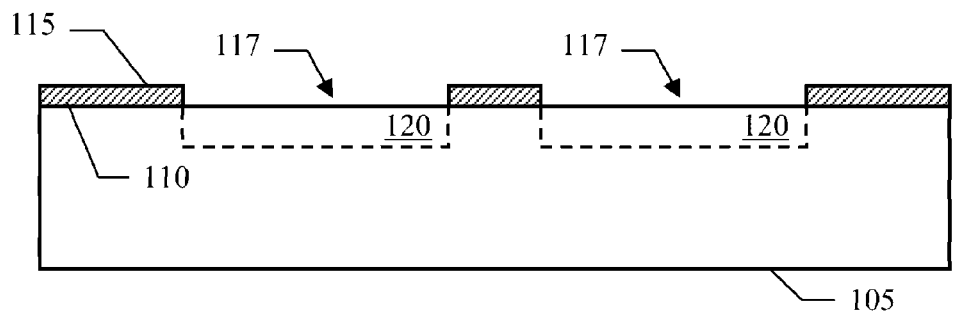
FIGS. 1a-1g show the various phases of a manufacturing process of an interconnection element according to different embodiments of the invention.

Considering in particular FIG. 1a, the manufacturing process starts with a wafer of mono-crystalline silicon 105. As described in detail in the following, the wafer 105 implements a lower substrate for interconnection leads; more specifically, the leads are formed on a (main) front surface 110 of the lower substrate 105 and then raised.

For this purpose, a photo-resist mask 115 is formed on top of the front surface 110. The photo-resist mask 115 is obtained by depositing a layer of photo-resist material and then patterning it through a photo-lithographic process; in this way, multiple windows are opened in the photo-resist material so as to expose corresponding contact areas 117 of the front surface 110 for the desired leads. The contact areas 117 may have any shape and size (according to the leads to be formed). For example, each lead consists of an elongated strip (such as with a length of 0.1-150 mm and a width of 0.5-100 $\mu$m). The strip may be straight, spiral-like, coil-like, undulated, and so on; moreover, the strip may end with one or two enlarged regions (such as with a square, rectangular or circular section).

The type of photo-resist material being used depends on the thickness of the leads (such as from 1 $\mu$m to 500 $\mu$m). For example, when the leads have a thickness lower than 50-80 $\mu$m, any type of photo-resist material (either positive or negative) may be used. Conversely, when the thickness of the leads is higher, it may be preferable to use a negative photo-resist material; indeed, this photo-resist material allows obtaining windows with an increased ratio between their height and width (up to 50). It should be noted that, when the thickness of the leads is high, the photo-resist material is generally deposited in two phases (such as by means of a spinning process). Experimental tests were performed with different photo-resist materials. For example, the positive photo-resist AZ9260 was used to make leads with a width of 5 $\mu$m and a thickness of 3-10 $\mu$m, and with a width of 10 $\mu$m and a thickness of 3-25 $\mu$m; the negative photo-resist SU-8 was instead used to make leads with a width of 10 $\mu$m and a thickness of 100 $\mu$m.

In the solution according to an embodiment of the present invention, as described in detail in the following, the front surface 110 is treated so as to control an adhesion of the leads that will be formed thereon.

In this way, it is possible to avoid any undesired detachment of the leads from the lower substrate 105 (during their formation or during the next phases of the manufacturing process); at the same time, this does not prevent the raising of the leads from the lower substrate 105 when it is necessary.

It should be noted that the desired result is achieved in a very simple manner; Particularly, the proposed solution does not require any sacrifical layers (with a beneficial effect on the complexity of the manufacturing process).

Moreover, in this way it is possible to provide an improved level of quality; indeed, the operation of treating the front surface 110 may be controlled with a high accuracy, so as to reach the desired adhesion with the leads.

The interconnection elements so obtained provide a high density of the leads, even when they are relatively long (such as up to 150 mm). For example, it is possible to achieve about 5.000 leads/cm$^2$ or 12.500 leads/cm$^2$ in interconnection elements with a thickness of 1 mm and 0.4 mm, respectively (by using leads with a width of 10 µm). Moreover, the density of the leads may be further increased by reducing their width; for example, by using leads with a width of 3 µm it is possible to increase the density of the leads by a factor higher than 3.

In a specific implementation, the desired control of the adhesion of the leads is achieved by forming a layer of porous silicon. For example, the porous silicon is formed in regions 120 extending from the contact areas 117 into the lower substrate 105 (such as with a depth of 0.1-5 µm). For this purpose, the lower substrate 105 is subjected to an anodic process. Particularly, the lower substrate 105 is used as an anode in an electrochemical cell (including an electrolyte being rich of Hydrofluoric acid, or HF). When the current density of the anodic process is lower than a critical value $J_{PS}$ (depending on multiple experimental factors), the electrolyte only reacts with the holes that reach the front surface 110 of the lower substrate 105 (so that the reaction is limited by the feeding of the holes and not by their ionic diffusion into the electrolyte). Of course, this requires the availability of (free) holes on the front surface 110. The availability of holes is obvious if the lower substrate 105 is of the P-type. Conversely, if the lower substrate 105 is of the N-type the interface silicon-electrolyte acts as a reverse-biased Schottkly junction (i.e., with a depletion region whose width decreases as the concentration of impurities of the lower substrate 105 increases). Therefore, when the lower substrate 105 has a high concentration of impurities (N+) the free holes in the lower substrate 105 can pass through the potential barrier of this junction by quantum-mechanical tunneling; conversely, it is necessary to provide energy to the holes for allowing their passage through the potential barrier (for example, by lightening the front surface 110).

The porous silicon so obtained has a complex structure with a random network of small pores. The characteristics of the porous silicon depend on its morphology, which in turn is a function of different parameters of the anodic process (for example, the duration, the concentration and the type of impurities of the lower substrate 105, the current density, the type of electrolyte, and the like). In this context, the characteristics of the porous silicon that are exploited are the mechanical ones. The mechanical characteristics of the porous silicon strongly depend on its porosity, which is defined with respect to the mono-crystalline silicon as:

$$P\% = \left(1 - \frac{\rho_{PS}}{\rho_{Si}}\right)\%$$

where $\rho_{PS}$ is the density of the porous silicon and $\rho_{Si}$ is the density of the mono-crystalline silicon (i.e., 2.3 g/cm$^3$). The density of the porous silicon $\rho_{PS}$ can be measured by applying the following formula:

$$\rho_{PS} = \rho_{Si} - \frac{P_s - P_e}{S \cdot d}$$

where the values $P_s$ (initial weight of the lower substrate 105 before the anodic process), $P_e$ (ending weight of the lower substrate 105 after the anodic process) and d (depth of the porous silicon regions 120) can be measured, while the value S (extension of the contact areas 117) is known.

The porosity P % may be controlled by changing one or more parameters of the anodic process; for this purpose, it is very practical to act on the current density. For example, the following experimental results were obtained with a wafer of the N+ type having a resistivity of 0.01 Ωcm, which wafer was immersed into an electrolyte HF—$C_2H_5OH$ (with a HF concentration in volume of 32% and 12%, respectively); the anodic process was performed at room temperature, by applying the following current densities:

| Current Density | HF concentration, 32% in volume | HF concentration 12% in volume |
|---|---|---|
| 5 mA/cm$^2$ | — | P % ≈ 60% |
| 10 mA/cm$^2$ | P % ≈ 32% | P % ≈ 64% |
| 20 mA/cm$^2$ | P % ≈ 36% | P % ≈ 70% |
| 30 mA/cm$^2$ | P % ≈ 40% | P % ≈ 76% |
| 40 mA/cm$^2$ | P % ≈ 43% | P % ≈ 83% |
| 50 mA/cm$^2$ | P % ≈ 47% | P % ≈ 90% |

The adhesion of the leads to the contact areas 117 increases with the porosity P % of the porous silicon regions 120 (since the number of anchoring points of the leads to the lower substrate 105 is higher). Therefore, it is possible to obtain the desired adhesion of the leads (typically depending on their size) by simply controlling the porosity P % (i.e., by modulating the current density of the anodic process). For example, porous silicon regions 120 with a depth of 0.2 µm and a porosity P % of 32%-80% were successfully tested to form leads with a width of 2-100 µm and a thickness of 2-25 µm (which leads were retained by the lower substrate 105 during the next phases of the manufacturing process without preventing their raising when it was necessary).

As a further improvement, the porosity P % of the porous silicon regions 120 is modulated by decreasing it moving away from the contact areas 117. In this way, it is possible to have a higher porosity P % on the front surface 110 (so as to increase the adhesion of the leads) and a lower porosity P % inside the lower substrate 105 (so as to guarantee its integrity). For example, the porosity P % decreases from 40%-90% (such as 45%-80%, like 55%) at the front surface 110 to 0%-70% (such as 20%-50%, like 30%) at its maximum depth. For example, porous silicon regions 120 with a depth of 0.25 µm and a porosity P % from 90% to 40% were used to obtain an adhesion of 200 MPa for leads having a width of 20 µm.

The desired result may be achieved by simply modulating the current density over time during the anodic process. Preferably, for this purpose the current density is decreased from a starting value to an ending value in the range of 5%-20% the starting value, and still more preferably in the range of 7%-15% the starting value (such as 10% thereof). For example, a reduction of the porosity P % from 90% to 50% was achieved by modulating the current density from 50 mA/cm$^2$ to 5 mA/cm$^2$ (in an electrolyte HF—$C_2H_5OH$ with a HF concentration in volume of 12%).

It should be noted that the anodic process may also be carried out before forming the photo-resistive mask 115 (so as to obtain a single layer of porous silicon—not shown in the figure—extending throughout the whole lower substrate 105). In this case, however, the porous silicon layer must be protected before any photolithographic process; indeed, the larger surface exposed by the porous silicon layer (due to its porosity) magnifies the etching rate of alkaline solutions that are generally used for developing the photo-resist materials. Therefore, the porous silicon layer would be subjected to a significant etching during the formation of the photo-resistive mask 115 (which etching is instead negligible when the lower substrate 105 is completely made of a mono-crystalline silicon). In order to avoid this problem, it is possible to provide a (thin) protective layer on the porous silicon layer; for example, a protective layer with a thickness down to 0.1 μm is enough to prevent any undesired etching of the porous silicon layer. The protective layer is made of a metal (such as nickel, copper, palladium or gold), which is deposited on the porous silicon layer by means of an electro-plating process in an acid solution.

Figure 1B:
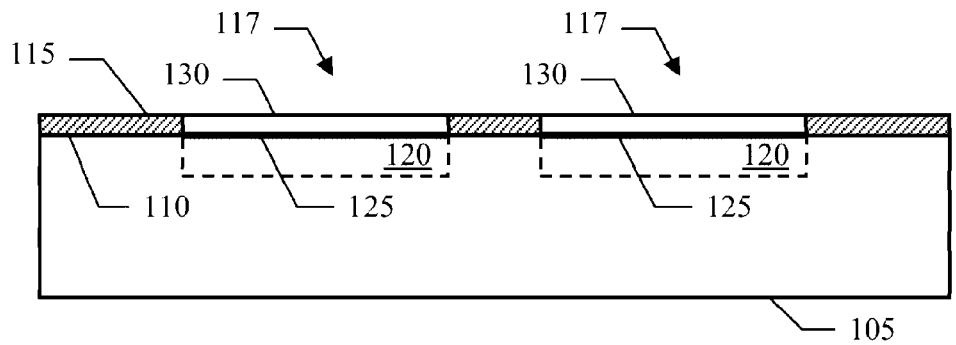

Moving now to FIG. 1b, in order to increase the uniformity of the resulting leads, a precursor layer 125 is optionally formed on the contact areas 117 (through the corresponding windows of the photo-resist mask 115). For example, the precursor layer 125 consists of a metal (such as copper, gold or palladium), which is deposited by means of an electroless process. Particularly, a precursor layer 125 of copper may be formed by exploiting a solution in de-ionized water including copper sulfate (for the deposition of the copper) and hydrofluoric acid (for removing any oxide in the pores of the porous silicon regions 120). Experimental results showed that it is possible to obtain a precursor layer 125 with a thickness ranging from 5 nm to 0.5 μm in 30 s, by varying the copper sulfate concentration from 0.1 g to 10 g and the hydrofluoric acid concentration from 1 ml to 10 ml per 100 ml of solution (for longer deposition times, the deposited copper becomes a dust).

At this point, leads 130 are formed on top of the precursor layer 125. Typically, the leads 130 consist of one or more metal layers, which are deposited by means of an electroplating process. For example, the leads 130 are made of nickel, copper, chrome, platinum, silver, palladium, or whatever binary and/or ternary alloy; alternatively, the leads 130 have a multi-layer structure, such as nickel-copper-nickel, gold-copper-gold, or palladium-gold-nickel-copper-nickel-gold-palladium. In this way, the current being used to implement the corresponding electroplating process passes through the porous silicon regions 120; as a result, the metal is deposited within the pores, so as to increase the adhesion of the leads 130 to the lower substrate 105.

It should be noted that if the porous silicon regions 120 were not protected by the precursor layer 125, the deposition of the leads 130 should be performed with an acid solution. Of course, this is necessary only for the first deposition process (when the leads 130 have a multi-layer structure). In any case, if an alkaline solution has to be used for forming the leads 130, it is sufficient to deposit a thin protective layer beforehand with an acid solution (for example, consisting of copper or nickel and with a thickness of at least 0.1 μm); this protective layer may then be etched at the end of the process (after the removal of the lower substrate 105).

Figure 1C:
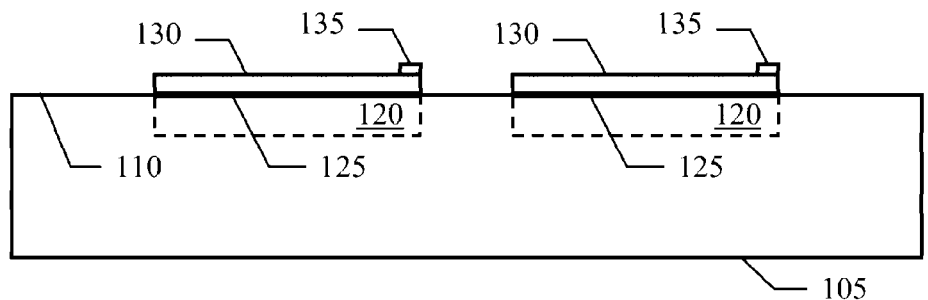

As shown in FIG. 1c, a bonding contact 135—consisting of a conductive material—is formed at an end of each lead 130. For example, the bonding contacts 135 consist of a solder alloy (such as SnPb, Sn, SnBi or SnAgCu); the solder alloy is deposited selectively by means of an electro-plating process (through a photo-resist mask suitably patterned), or by means of a silk-screen printing process. Alternatively, it is possible to use an adhesive paste, which is deposited by means of a silk-screen printing process. Furthermore, the bonding contacts 135 may consist of a metal (such as gold and/or copper); in this case, the bonding contacts 135 are obtained by means of a thin film process or an electro-plating process.

Figure 1D:
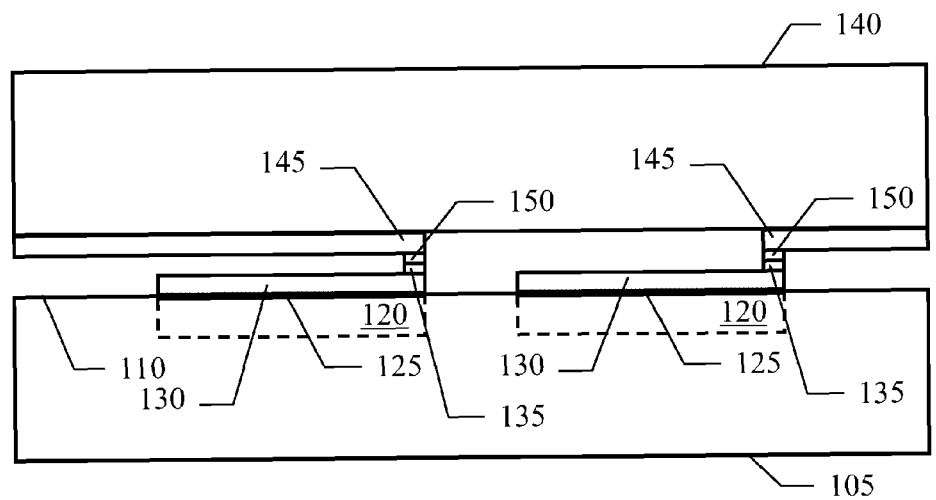

Proceeding to FIG. 1d, an upper substrate 140—for example, consisting of another silicon wafer or a printed circuit board (PCB)—is used to raise the leads 130. For this purpose, conductive tracks 145 are formed on a lower surface of the upper substrate 140 (facing the lower substrate 105). The conductive tracks 145 are provided with a bonding contact 150 for each bonding contact 135 of the lower substrate 105; the bonding contacts 150 are made of the same material as the bonding contacts 135 (i.e., solder alloy, adhesive paste or metal).

The upper substrate 140 is placed in front of the lower substrate 105; the bonding contacts 150 are aligned with the bonding contacts 135, and then connected thereto. For this purpose, it is possible to use different well-known techniques—for example, the ones commonly exploited in the field of Silicon On Insulator (SOI) structures or in the field of MEMS technologies. When the bonding contacts 135 and 150 are made of metal, their connection may be carried out by exploiting wafer bonding machines, which implement a thermo-compression process or an anodic soldering process. For example, if the metal is gold a temperature of about 200° C. is sufficient for obtaining the gold-gold soldering, whereas if the metal is copper a temperature of about 400° C. may be required to obtain the copper-copper soldering. On the other hand, when the bonding contacts 135 and 150 are made of solder or adhesive paste it is also possible to use two simple rectified plates capable of supporting the lower substrate 105 and the upper substrate 140 (for example, by means of vacuum or electrostatic/magnetic force). For this purpose, circular or squared plates with a high planarity are commercially available (for example, with a diameter/side up to 300 mm and a planarity error lower than 13 μm); these plates may be moved in a controlled way with a very high accuracy (of the order of some μm for movements up to 15-20 cm).

Figure 1E:
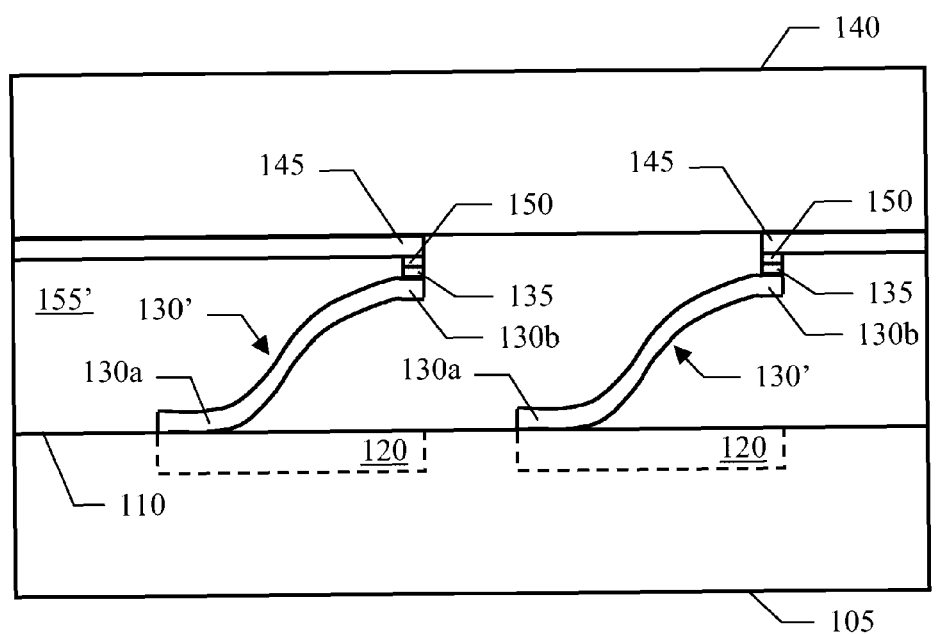

Once the bonding contacts 150 have been soldered or glued to the bonding contacts 135, the upper substrate 140 and the lower substrate 105 are spaced apart—as shown in FIG. 1e. For this purpose, the opposed free surfaces of the upper substrate 140 and of the lower substrate 105 are fastened to corresponding planar plates (for example, by means of vacuum or electrostatic/magnetic force). The plates are then moved away from each other (typically, by keeping one plate stationary and moving the other one). The movement has a vertical component (perpendicular to the front surface 110), so as to displace the upper substrate 140 from the lower substrate 105 by a predefined distance (such as from 50 μm to 150 mm). In this way, a portion of each lead (starting from its end with the bonding contacts 135, 150) detaches from the lower substrate 105 as the upper substrate 140 rises. Therefore, the leads will now extend between the upper substrate 140 and the lower substrate 105 (with the extended leads—including their precursor layers—that are denoted as a whole as 130'). Particularly, each (extended) lead 130' has a lower end 130a (opposed to the bonding contacts 135, 150), which remains connected to the lower substrate 105; an upper end 130b of the lead 130' (with the bonding contacts 135, 150) is instead connected to the upper substrate 140 through the conductive tracks 145. It should be noted that the porous silicon regions 120 allow peeling the leads 130', at the same time preventing their complete detachment from the lower substrate 105.

In a different implementation (not shown in the figure) it is also possible to provide an horizontal component of the movement between the upper substrate 140 and the lower substrate 105 (parallel to the front surface 110), so as to slide the upper substrate 140 with respect to the lower substrate 105; for example, the upper ends 130*b* of the leads 130' may be aligned (perpendicularly to the front surface 110) with the lower ends 130*a*.

Experimental results showed that a vacuum of the order of 500 mtorr (readily obtainable by means of commercial available vacuum rotatable pumps) is enough for raising about 1.000 leads 130'. For this purpose, a force of some Kg must be applied to the plates for moving away the upper substrate 140 and the lower substrate 105; this movement can be controlled with a high accuracy by means of commercially available handling systems (for example, capable of applying a force up to 10 Kg with an accuracy of some nm for a stroke even higher than 1 cm).

At this point, a flowable insulating material is injected between the upper substrate 140 and the lower substrate 105 (for example, by casting or under pressure). The insulating material may be silicone, an epoxidic, thermoplastics or thermosetting resin, or a casting ceramic; the insulating material may also be loaded with nano-particles (for example, nano-balls with a diameter of 15-180 nm made of $Al_2O_3$, AlN, BN, $SiO_2$ or $Si_3N_4$) in order to increase the stiffness and/or the thermal conductivity of the insulating material. The insulating material should have a low viscosity (for example, below 500 St). For this purpose, the structure formed by the lower substrate 105 and the upper substrate 140 may also be enclosed in a degassing system, so as to prevent the formation of any air bubbles that may appear during the injection of the insulating material when its viscosity is relatively high (for example, above 10 St). In this way, the insulating material fills the whole space between the upper substrate 140 and the lower substrate 105, thereby completely surrounding the leads 130'. The insulating material is cured so as to obtain a corresponding layer 155, which embeds all the leads 130'. According to the insulating material that was injected between the upper substrate 140 and the lower substrate 105, the insulating layer 155 may be either elastic or rigid.

Figure 1F:
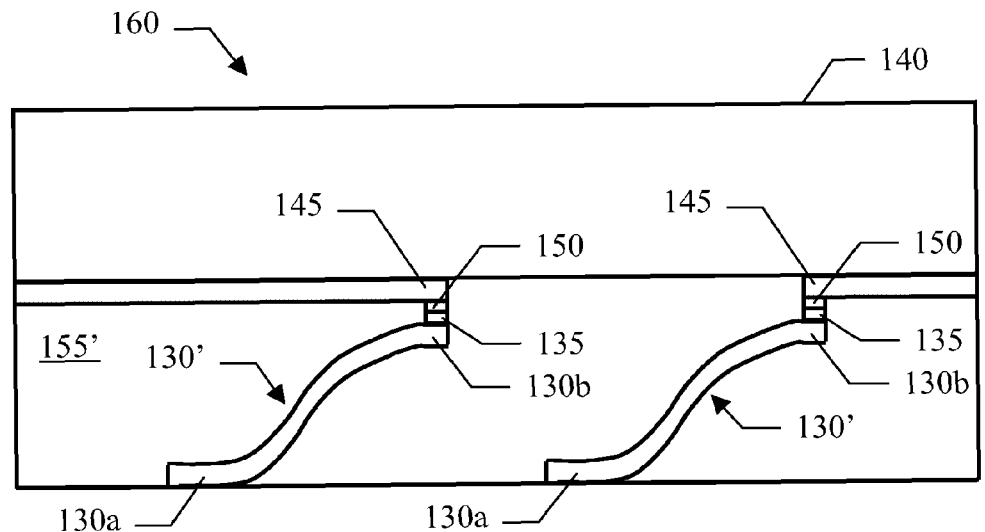

With reference now to FIG. 1*f*, the lower substrate is removed. For this purpose, when the insulating layer 155 is rigid and it does not adhere on the lower substrate, a mechanical action is sufficient for separating the lower substrate from the rest of the structure. Conversely, the separation of the lower substrate may be achieved by means of a wet etching process (either of the anisotropic or isotropic type). In any case, the operation exposes the lower ends 130*a* of the leads 130'. The structure so obtained is then diced, so as to provide a plurality of interconnection elements 160 (only one shown in the figure); each interconnection element 160 includes a plurality of leads 130' (for example, from 10 to 10.000). The interconnection element may be used to connect one or more electronic devices (not shown in the figure) to the lower ends 130*a*, so as to couple them with the upper substrate 140 (through the leads 130'). For this purpose, it is also possible to form one or more metal layers (not shown in the figure) on the lower ends 130*a* (for example, by means of a thin film process or a thick film process).

Figure 1G:
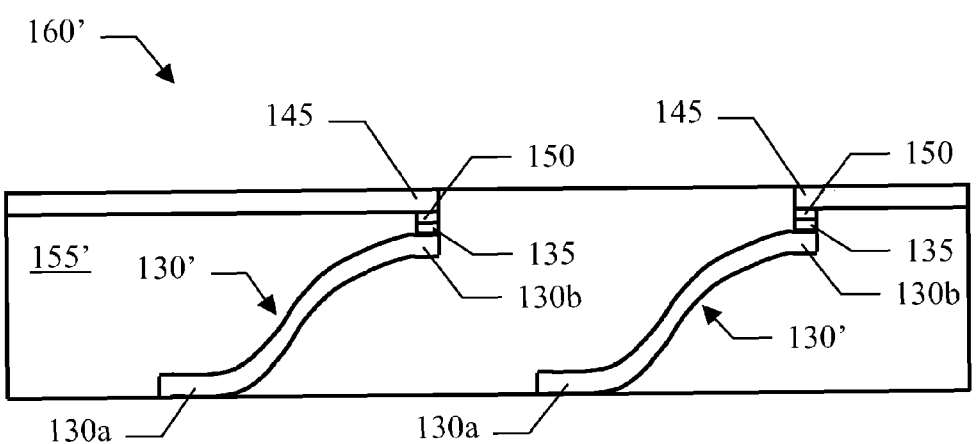

Alternatively, as shown in FIG. 1*g*, the upper substrate as well is removed (before the dicing operation). For example, the upper substrate may consist of another wafer—on which the corresponding conductive tracks have been deposited by means of a thin film process or an electroplating process (when a thickness higher than 2-3 μm is required); in this case, the conductive tracks may also be replaced with a uniform (single or multiple) conductive layer being formed on the whole surface of the upper substrate. As above, one or more regions of porous silicon may be formed on the surface of the upper substrate to ensure the desired adhesion of the conductive tracks/layer thereon. In any case, the upper substrate is removed with the same techniques described above for the lower substrate (without substantially affecting the conductive tracks/layer). It should be noted that when a uniform conductive layer has been formed on the upper substrate, the conductive tracks 145 may be obtained (after the removal of the upper substrate) by means of a selective wet etching process; for this purpose, the desired portions of the conductive layer are protected by a photo-resist mask suitably patterned (while the insulating material 155 is typically capable of withstanding the etching for the short period typically required to pattern the conductive layer).

As above, the structure so obtained is then diced so as to provide a plurality of interconnection elements—only one shown in the figure (differentiated by means of a prime notation—i.e., 160'); each interconnection element 160' is either rigid or flexible (according to the characteristics of the insulating layer 155). The interconnection element 160' may be used to couple any electronic devices (not shown in the figure) between the two opposed main surfaces of the insulating layer 155 through the leads 130'; for this purpose, the electronic devices are connected to the lower ends 130*a* of the leads 130' or to the conductive tracks 145 (coupled with the upper ends 130*b* of the same leads 130').

Figure 2A:
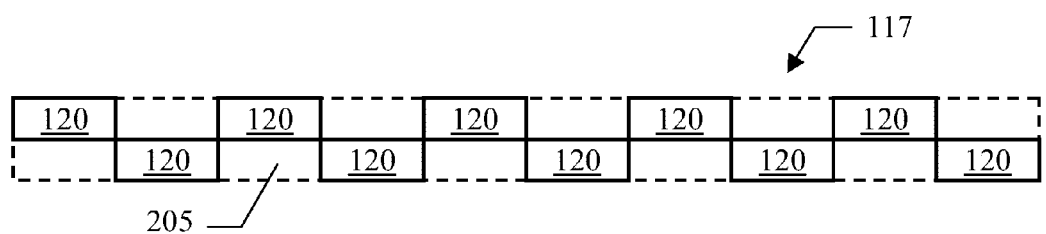
FIGS. 2a-2b detail a phase of this manufacturing process according to specific embodiments of the invention.

Considering now FIG. 2*a*, the desired adhesion of the leads to the lower substrate may also be achieved by forming the porous silicon regions 120 selectively in its contact areas 117 (only one shown in the figure). More specifically, in each contact area 117 the porous silicon regions 120 (one or more) are formed in a selected portion thereof, while a remaining (passive) portion 205 of the contact area 117 maintains its mono-crystalline structure. For this purpose, the front surface of the lower substrate is covered by a corresponding photo-resist mask suitable patterned (before the formation of the one used for the leads); this photo-resist mask protects the passive portion 205 and exposes the desired portion of the contact area 117, wherein the porous silicon regions 120 will then be formed during the corresponding anodic process.

The porous silicon regions 120 may have any shape (for example, a rectangular, a square or a circle). In an embodiment of the invention (as shown in the figure), the porous silicon regions 120 are distributed uniformly throughout the contact area 117. The concentration of the porous silicon regions 120 in the contact area 117 determines its (average) adhesion as a whole. For example, let us consider a porous silicon that would provide an adhesion of 200 MPa in a contact area 117 of $10^4$ $mm^2$; if the porous silicon is formed only in one hundred regions 120 each one of 1 $mm^2$, the total adhesion of the contact area 117 will become $(200*100)/10^4 = 2$ Mpa. The same result may also be achieved by means of a single porous silicon region of 100 $mm^2$ (for example, consisting of a narrow strip extending along the contact area 117).

Figure 2B:
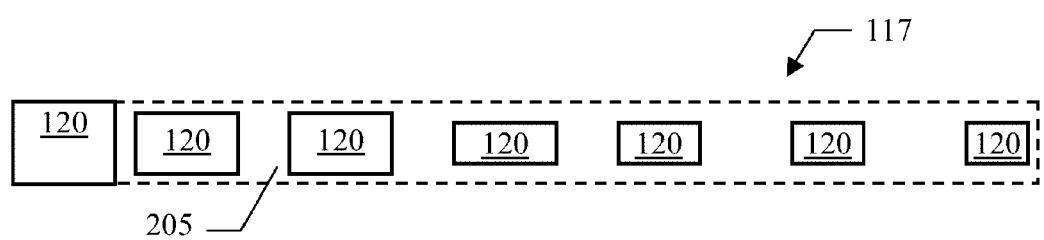

In a different embodiment of the invention, as shown in FIG. 2*b*, the concentration of the porous silicon regions 120 in the contact area 117 decreases moving from the lower end of the corresponding lead to the upper end thereof. The adhesion may decrease from a maximum value (at the lower end of the lead) to a minimum value (at the upper end of the lead) equal to 0.01%-60% of the maximum value, for example equal to 0.1%-10% of the maximum value (such as 0.5%-1% thereof). For example, the adhesion at the lower end of the lead may be about 100 MPa, while the adhesion at the upper end thereof may be 0.1 MPa.

The desired result may be achieved by reducing the number and/or the size of the porous silicon regions 120 (moving from the lower end to the upper end of the lead). For example, in the case at issue the porous silicon regions 120 shrink and disperse from the right to the left. In this way, it is possible to have a lower adhesion close to the upper end of the lead, so as to facilitate its peeling; at the same time, a high adhesion is maintained close to the lower end of the lead, so as to avoid any risk of its detachment.

Figure 3A:
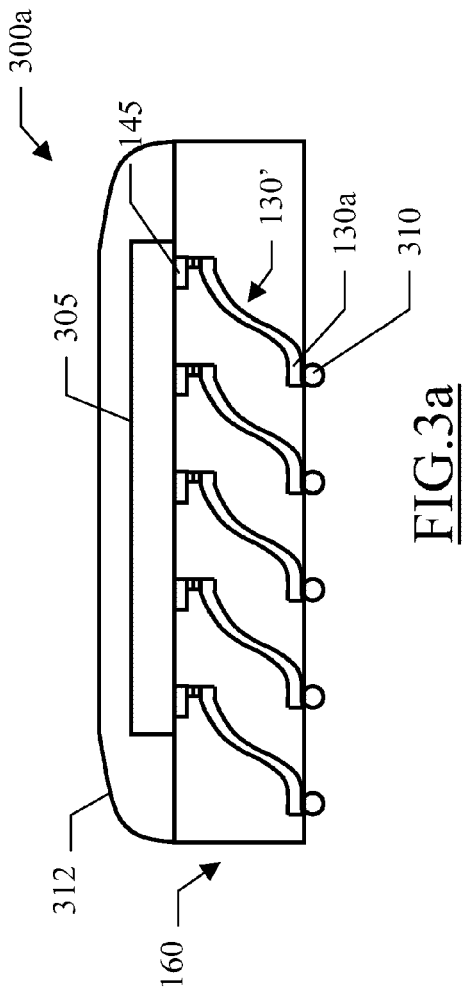
FIGS. 3a-3b are pictorial representations of an electronic assembly according to different embodiments of the invention.

An exemplary application of the above-described interconnection element 160 is illustrated in FIG. 3a. Particularly, the figure shows a structure that is used to package a chip 305. The chip 305 is formed in a corresponding area of the wafer implementing the upper substrate (which provides a plurality of identical components after its dicing). In this case, the conductive tracks 145 implement terminals of the chip 305, which are then connected to the corresponding leads 130' during the process of manufacturing the interconnection element 160. At this point, conductive balls 310 are soldered or deposited on the lower ends 130a. The chip 305 is typically covered by a protective cap 312 (for example, of a plastic material); the protective cap 312 is formed on top of the insulating layer 155, so as to completely enclose the chip 305.

Figure 3B:
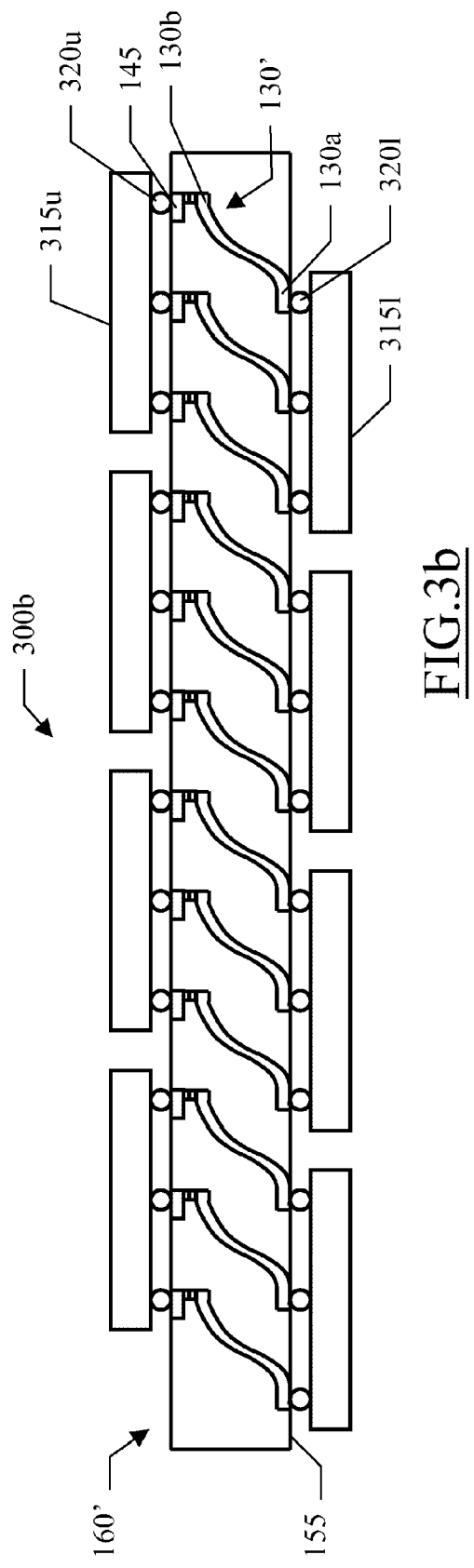

An exemplary application of the interconnection structure 160' is instead illustrated in FIG. 3b. Particularly, the figure shows a multi-chip module 300b. The multi-chip module 300b is used to assemble a plurality of chips 315l and 315u (for example, integrating circuits of the digital type and/or of the power type). More specifically, each chip 315l is arranged below the interconnection structure 160'; the chip 315l is provided with a plurality of terminals 320a (in the form of balls in the example at issue), which are connected to corresponding lower ends 130a of the leads 130'; on the other hand, each chip 315u is arranged above the interconnection structure 160'; the chip 315u is provided with a plurality of similar terminals 320u, which are connected to corresponding conductive tracks 145 being coupled with the upper ends 130b of the leads 130'. This allows obtaining a 3-dimensional structure (which is then typically embedded into a package).

With reference now to FIGS. 4a-4f, the various phases of a process for manufacturing a test card according to different embodiments of the invention are illustrated. The test card may be used to test any kind of electronic devices, such as chips at the wafer level (in this case, commonly referred to as probe card) or components in packaged form. For the sake of simplicity, in the following the elements corresponding to the ones shown in the preceding figures will be denoted with similar references obtained by changing their first number from "1" to "4-" (and their explanation will be omitted).

Figure 4A:
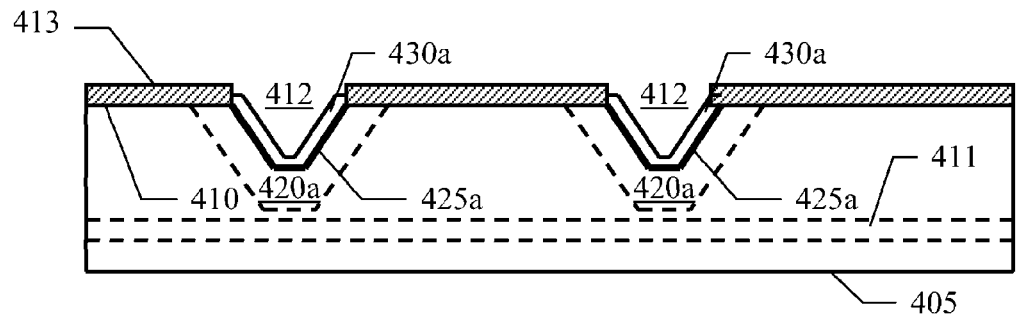
FIGS. 4a-4f show the various phases of a manufacturing process of a test card according to different embodiments of the invention.

Considering in particular FIG. 4a, the manufacturing process again starts with a lower substrate 405 (consisting of a wafer of mono-crystalline silicon), on a front surface thereof 410 the leads to be raised are formed. The lower substrate 405 also includes a stop layer 411, whose purpose will be apparent in the following. The stop layer 411 has a high concentration of impurities of the P-type (such as higher than $5 \cdot 10^{19}$ atoms/cm$^3$); for example, the stop layer 411 is obtained by means of an implantation or a diffusion of P-type impurities in the lower substrate 405. In this case, as described in detail in the following, each lead will be used to define a corresponding probe for contacting terminals of the electronic devices to be tested (for example, in the form of pads or balls).

For this purpose, multiple grooves 412 (extending from the front surface 410 into the lower substrate 405) are created. In the example shown in the figure, the groves 412 have a frusto-pyramidal shape with a trapezoidal profile (for obtaining corresponding probes that will be used to contact bumps of the electronic devices under test). The grooves 412 are defined by means of a wet etching process of the anisotropic type; for example, the desired result may be achieved as described in WO-A-2006/066620 (the entire disclosure of which is herein incorporated by reference).

Briefly, the lower substrate 405 exposes a crystal plane providing a high etching rate—for example, with a crystallographic orientation defined by the Miller index <100>, so that a crystal plane (111) forms an angle $\alpha=54.7°$ with the front surface 410. A mask 413 is formed on the front surface 410, with windows exposing areas corresponding to the lower ends of the leads to be formed (typically, with a rectangular or a squared shape); for example, the mask 413 consists of silicon nitride, Boron-Doped Phosphosilicate Glass (BPSG) or a composite structure with a lower layer of silicon nitride (with larger windows for the next manufacturing phases) and an upper layer of BPSG (with the desired windows). The lower substrate 405 is then immersed into a suitable chemical solution, so as to etch it through the windows of the mask 413. The process is relatively fast until the crystal plane (111) is encountered (after that the etching rate can be deemed negligible); in this way, each groove 412 so obtained will have lateral surfaces extending at the angle a from the front surface 410 and a rectangular bottom surface (whose size depends on the length of the etching process). The same result may also be achieved by providing a stop layer in the lower substrate 405 (not shown in the figure); this stop layer blocks the etching of the lower substrate 405 (for example, thanks to a high concentration of impurities or to a suitable crystallographic orientation), so as to provide the desired shape of the grooves 412 irrespectively of the length of the etching process.

Alternatively, the grooves (not shown in the figure) have a triangular profile—for obtaining corresponding probes that will be used to contact pads of the electronic devices under test; particularly, the grooves may consist of a polyhedron (with two trapezoidal faces and two triangular faces that joint into an edge) or of a pyramid (with four triangular faces that joint into a vertex). This result is achieved by continuing the etching until only facets of the crystal plane (111) remain exposed, so that the base of each groove collapses into the edge or the vertex (when the corresponding windows are rectangular or squared, respectively).

The same mask 413—or another mask (not shown in the figure) with windows slightly larger than the ones of the mask 413 (for example, simply obtained by removing the BPSG layer in case of the above-mentioned composite structure)—is used to form porous silicon regions 420a by means of an anodic process; the porous silicon regions 420a extend from the (lateral and bottom) surfaces of the grooves 412 into the lower substrate 405, just above the stop layer 411 (for example, at a few µm therefrom). A precursor layer 425a is optionally electroless deposited on the surfaces of the groves 412. A layer 430a (or more) of a conductive material suitable to form the probes is selectively deposited on the precursor layer 425a (by means of an electro-plating process). The material of the layer 430a should be relatively hard, abrasion-resistant, and scarcely oxidable. The hardness of this material may be higher than 200 Vickers, such as of the order of 200-1.000 Vickers, or 400-600 Vickers, like 500 Vickers. For example, the (hard) layer 430a consists of a metal such as nickel or its alloys, chrome-molybdenum alloy, palladium-cobalt alloy, palladium-nickel alloy, rhodium, or ruthenium (with a thickness in the range from 0.1 µm to 10 µm).

Figure 4B:
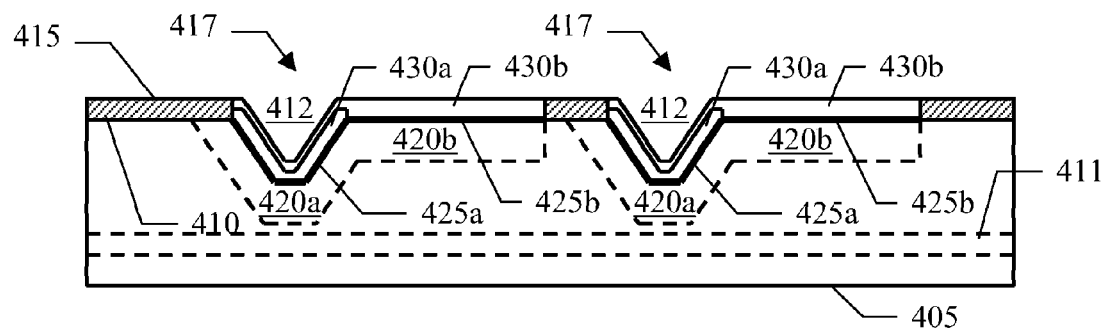

Moving now to FIG. 4b, as above a further photo-resist mask 415 is formed on the front surface 410, with windows exposing contact areas 417 for the desired leads (each one including the corresponding groove 412 with the hard layer 430a). Further porous silicon regions 420b are formed by means of another anodic process through the photo-resist mask 415 (using either the same parameters or not with respect to the preceding anodic process). The porous silicon regions 420b extend into the lower substrate 405 from the exposed portions of the contact areas 417 (being not covered by the hard layer 430a). It should be noted that the anodic process for the formation of the porous silicon regions 420b is relatively short (for example, 30 s-300 s), so that is does not cause any appreciable etching of the hard layer 430a; at most, the anodic process generates a slight roughness of the hard layer 430a, which roughness facilitates the adhesion with the next layer(s) used to complete the leads. As above, a precursor layer 425b is optionally electroless deposited on the exposed portions of the contact areas 417. At this point, the leads are completed by means of a layer 430b (or more) of a conductive material suitable for their raising. The layer 430b is selectively deposited through the photo-resist mask 415 (i.e., on the hard layer 430a and the precursor layer 415b) by means of an electro-plating process. The material of the layer 430b should be a ductile material, less hard than the one used for the layer 430a (so as to provide the required flexibility of the leads). The hardness of this material may be lower than 200 Vickers, such as of the order of 20-150 Vickers, or 40-100 Vickers, like 50 Vickers. For example, the (flexible) layer 430b is made of the same material(s) as indicated above for the whole leads.

Figure 4C:
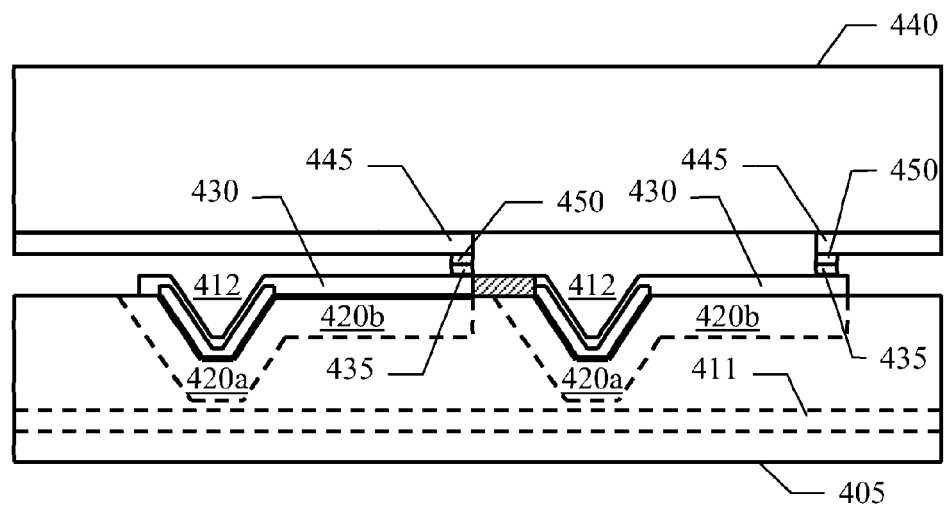

As shown in FIG. 4c, each lead so obtained (denoted as a whole with 430) is provided with a bonding contact 435 at an end of the flexible layer 427 (opposed to the corresponding groove 412). An upper substrate 440 is then coupled with the lower substrate 405. In this case, the upper substrate 440 consists of a circuitized substrate (such as a mono- or multi-layer PCB) for routing the desired signals in the test card—with an optional compliant interposer for compensating any warp of the electronic devices under test. As above, the upper substrate 440 is provided with conductive tracks 445, wherein bonding contacts 450 are formed; the upper substrate 440 is placed in front of the lower substrate 405, and the bonding contacts 450 are soldered or glued to the bonding contacts 435.

Figure 4D:
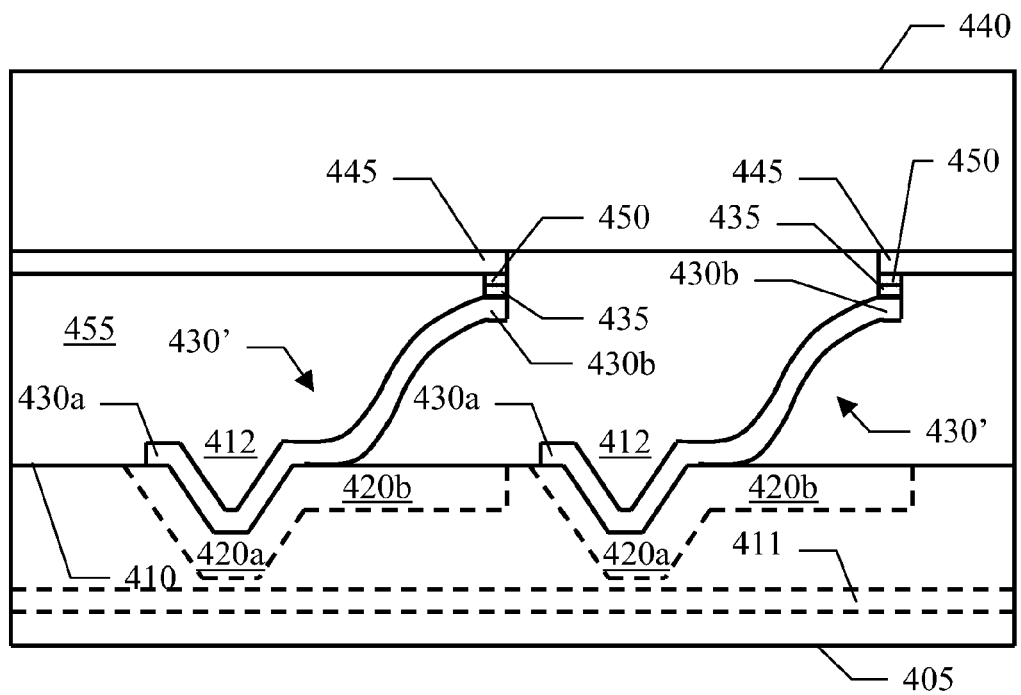

Moving to FIG. 4d, the upper substrate 440 and the lower substrate 405 are spaced apart, so as to raise the leads. As above, each (extended) lead—differentiated with a prime notation, i.e., 430'—has a lower end 430a (including its frusto-pyramidal portion being formed in the corresponding grove 412), which remains connected to the lower substrate 405; an upper end 430b of the lead 430' (with the bonding contacts 435, 450) is instead connected to the upper substrate 440 through the conductive tracks 445. The porous silicon regions 420a, 420b again allow peeling the leads 430' at the same time preventing their complete detachment from the lower substrate 405. At this point, a flowable insulating material is injected between the upper substrate 440 and the lower substrate 405, and it is then cured so as to obtain a corresponding insulating layer 455 (embedding all the leads 430'), preferably of the elastic type.

Figure 4E:
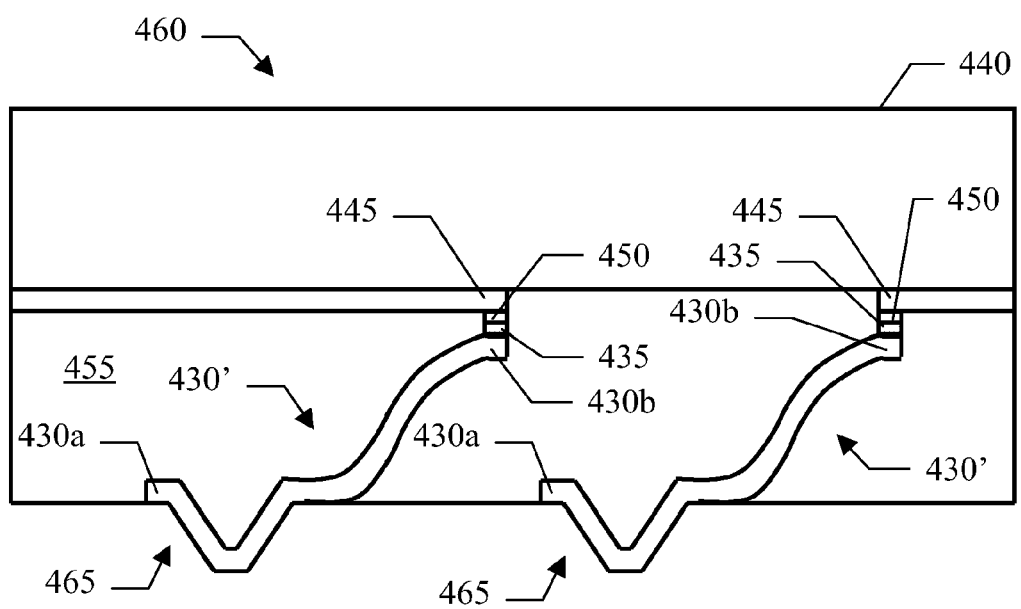

With reference to FIG. 4e, the lower substrate is removed. In this case, any damage to the (exposed) portions of the leads 430' that will form the probes should be avoided (when the separation is performed by means of a wet etching process). For example, it is preferable to use a wet etching process of the anisotropic type (whose etching rate on the leads 430' is negligible). In addition or in alternative, the lower substrate is etched only partially—without reaching the leads 430'; a remaining portion of the lower substrate is then removed by means of a dry etching process (which does not damage the leads 430'). This result is achieved by means of the stop layer 411 (see FIG. 4d), which strongly reduces the etching rate (by a factor about 50). In this way, it is possible to approach the leads 430' with a very high accuracy (irrespectively of the etching time). The remaining layer of the lower substrate may then be removed in a reasonable time by means of a standard Reactive Ion Etching (RIE) process, even if it provides a relatively low etching rate (such as 0.3-2 μm/minute). Alternatively, it is also possible to control the length of the wet etching process so as to stop it before reaching the leads 430' (without the use of any stop layer); for example, a layer of the lower substrate with a thickness of 10 μm-30 μm is maintained below the leads 430'. The remaining (thicker) layer of the lower substrate is now removed by means of a Deep RIE process (for example, based on $SF_2$, $CF_4$, $O_2$ or a combination thereof), which provides a far higher etching rate (such as up to 10 μm/minute).

In any case, the operation exposes the lowers ends 430a of the leads 430', with their pyramidal portions that projects downwards from the insulating layer 455. This generates a test card 460, whose probes 465 are defined by the exposed lower ends 430a of the leads 430'. The test card 460 may be used to test one or more electronic devices (not shown in the figure), having a plurality of terminals that are contacted by the probes 465 (in the form of balls in the example at issue). The probes 465 have a complaint structure (thanks to the elasticity of the insulating layer 455), so as to ensure the correct contact of the electronic devices under test; moreover, the probes 465 deform so as to embrace their terminals (i.e., balls). Alternatively, when the probes (not shown in the figure) end with an edge or a vertex, they are well suited to scrub any native oxide layer of the terminals of the electronic devices under test (especially when in the form of pads). In any case, the hard layer being used for forming the leads 430' ensures the required mechanical characteristics of the probes 465 (without adversely affecting the raising of the leads thanks to their flexible layer).

Figure 4F:
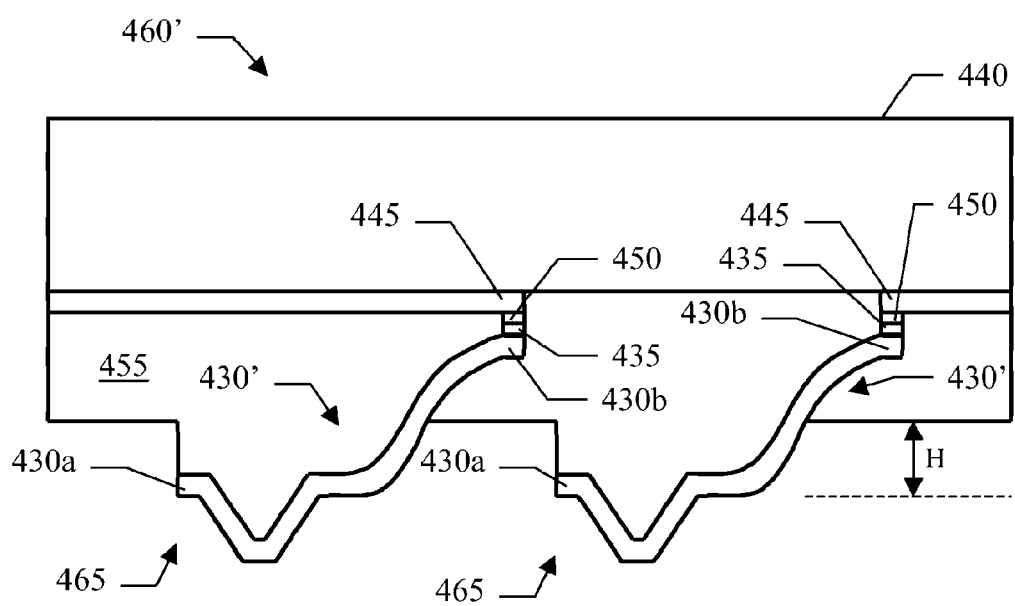

In a different embodiment of the invention, as shown in FIG. 4f, an external portion of the insulating layer 455 (such as made of silicone or any other elastic polymer) is further removed. Typically, the insulating layer 455 is removed for a depth equal to 0.1%-70%, and more preferably equal to 5-60% (such as 50%) of a whole thickness of the (original) insulating layer 455; for example, this operation may remove from 10 μm to 300 μm of the insulating layer 455.

For this purpose, the insulating layer 455 is etched by means of a RIE process—for example, based on a mixture of $SF_6$, $CF_4$, $O_2$, $CHF_3$ (which provides an etching rate of the silicone in the order of 20 μm/hour) or based on a mixture of $SF_6$, $CHF_3$ and $O_2$ (which provides an etching rate of the silicone up to 30 μm/hour). The same result may also be achieved by means of an ablation laser process (wherein the material is removed through sublimation). For example, with a pulsed laser having an ultraviolet wavelength, the minimal fluence for obtaining the removal of the silicone is 140 mJ/cm$^2$; naturally, it is possible to increase the laser fluence, so as to obtain higher ablation rates of the silicone (such as 1 mm per 100 shots). In this case, the laser may also be replaced with pulsed ultraviolet lamps (which provide a fluence higher than the above-mentioned threshold needed for ablating the silicone). In any case, the process of removing the desired portion of the insulating layer 455 is self-aligned, with the lower ends 430a of the leads 430' that act as a mask allowing the removal of the insulating layer 455 only when it is not protected.

This generates a different test card wherein each resulting probe (differentiated with a prime notation, i.e., 460' and 465', respectively) may move independently. This is particularly advantageous when the test card 465' consists of a probe card (being used to test electronic devices at the wafer level).

MODIFICATIONS

Naturally, in order to satisfy local and specific requirements, a person skilled in the art may apply to the solution described above many logical and/or physical modifications and alterations. More specifically, although one or more embodiment of the present invention have been described with a certain degree of particularity, it should be understood that various omissions, substitutions and changes in the form and details as well as other embodiments are possible. Particularly, the proposed embodiment(s) may even be practiced without the specific details (such as the numerical examples) set forth in the preceding description to provide a more thorough understanding thereof; conversely, well-known features may have been omitted or simplified in order not to obscure the description with unnecessary particulars. Moreover, it is expressly intended that specific elements and/or method steps described in connection with any disclosed embodiment of the invention may be incorporated in any other embodiment as a matter of general design choice.

Particularly, the proposed embodiment(s) may be implemented with equivalent processes (by using similar steps, removing some steps being non-essential, or adding further optional steps); moreover, the steps may be performed in a different order, concurrently or in an interleaved way (at least in part). Similar considerations apply if the manufacturing processes use other materials, technologies, layouts, masks (different in number and/or type), and the like.

It should be readily apparent that the leads may have any other shape and/or size; moreover, they may be made of one or more different conductive materials. Moreover, any kind of substrate may be used to raise the leads (for example, a wafer, a PCB, a carrier for one or more chips, and the like). Alternatively, the leads may be coupled with the upper substrate in any other way (for example, with the bonding contacts only on the lower substrate or the upper substrate). Any other relative movement between the upper substrate and the lower substrate is contemplated (such as with two horizontal components in opposite directions).

In any case, it is emphasized that any combination of the above-described features is possible; for example, interconnection elements manufactured without the grooves in the lower substrate may be used for the test cards, or the manufacturing process based on the grooves in the lower substrate may also be used to obtain interconnection elements for different purposes (such as for the above-described electronic assemblies).

Alternatively, the porous silicon regions may be replaced with equivalent adhesion promoting regions (capable of increasing the adhesion of the leads on the front surface). For example, nothing prevents the use of a lower substrate of a different type (such as made of glass); the adhesion may be controlled by means of an adhesive layer, a thin metal layer deposited through a thin film process (for example, made of V, Nb or Ti, with a thickness lower than 200 nm—such as 30-40 nm), or any other adhesion promoter. More generally, the use of any other techniques for treating the front surface to control the adhesion of the leads to be raised is within the scope of the invention.

Similar considerations apply if the porous silicon (either in a single layer or in multiple regions) is obtained with equivalent processes.

The porosity of the porous silicon may be modulated in any other way (to decrease it moving away from the front surface of the lower substrate). However, the use of porous silicon with a uniform porosity is contemplated.

Naturally, the proposed ranges for the values of the porosity are merely illustrative.

The desired result may be achieved by acting on any other parameter of the anodic process (or a combination thereof), such as the temperature.

In any case, the current density may be updated between different values and/or with any other time pattern (for example, according to a linear or logarithmic law).

The above-described distribution of the porous silicon regions in each contact area is merely illustrative; similar considerations apply if the porous silicon regions are in a different number, or with other size and/or shape. Naturally, nothing prevents providing the porous silicon throughout the whole extension of each contact area.

Likewise, the adhesion may be reduced moving along the leads in any other equivalent way. In this case as well, however, the use of always the same adhesion is not excluded.

As above, the proposed ranges for the values of the adhesion are merely illustrative.

The same result may also be achieved by changing only the number of the porous silicon regions (with the same size) or only their size (for the same number); alternatively, it is also possible to decrease the porosity of the material moving along the leads.

Any other metal may be deposited on the porous silicon—with either an electroless process or an electroplating process—to improve the uniformity of the leads (even if this feature may be omitted in some implementations).

Similar considerations apply if any other flowable insulating material is injected between the lower substrate and the upper substrate; moreover, the insulating material may be cured with any equivalent technique to obtain the desired layer of insulating material. In any case, nothing prevents leaving the extended leads exposed in a simplified implementation.

The grooves for the leads may have any other form and/or shape; moreover, any other technique may be used for their creation.

The different (hard and flexible) layers of the leads may consist of equivalent materials, or they may be formed with any other technique. In any case, nothing prevents making the leads with a uniform structure (for example, only with the harder metal when the leads are straight, so that no problem should take place during their raising).

Of course, the quantitative definition of the materials being used to form the hard and flexible layers must not be interpreted in a limitative manner.

The possibility of maintaining the lower substrate is also contemplated.

In any case, any other technique may be used for removing the lower substrate (even entirely based on a wet etching process).

Naturally, it is possible to use equivalent techniques for removing the external portion of the insulating layer.

In this case as well, the proposed ranges for the amount of insulating layer to be removed are merely illustrative.

As pointed out above, the upper substrate may be either maintained or removed (with any other technique).

Similar considerations apply if the proposed systems (i.e., the interconnection elements, the electronic assemblies—based on either a single chip or multiple chips—and the test cards) have a different structure or include equivalent components. In any case, these systems are not comprehensive (with the devised solution that may be applied in whatever other field).

Particularly, the proposed interconnection element may be used to couple any kind of electronic devices in the broadest acceptation of the term—such as chips, flexible or rigid PCBs, packages (for example, of the BGA, CSP, QFP, or Dual-In-Line type), and so on; likewise, the electronic devices may be provided with whatever terminals—such as pads, bumps, compliant bumps, stud bumps, pins (for example, of the gull-wing, J or leadless type).

It is emphasized that the above-described electronic assemblies may include any number and/or type of electronic devices—even combined in a multi-dimensional structure. In any case, the electronic devices may be coupled with the interconnection element either during its manufacturing process (when they consist of or are included in the lower substrate, the upper substrate or both of them) or after its production has been completed.

Similar considerations apply if the test board is used to test any other electronic devices (either at the wafer lever or at the package level). In this case as well, the other components of the test board may be coupled with the interconnection element either during its manufacturing process or afterwards.

It should be readily apparent that the proposed components might be part of the design of integrated circuits. The design may also be created in a programming language; moreover, if the designer does not fabricate chips or masks, the design may be transmitted by physical means to others. In any case, the resulting components may be distributed by its manufacturer in raw wafer form, as a bare die, or in packages. Moreover, the proposed components may be combined with other circuits in the same structure, or they may be mounted in intermediate products (such as mother boards). In any case, these components are suitable to be used in complex systems (such as test machines).

The invention claimed is:

1. A process of manufacturing an interconnection element for contacting electronic devices, the process including the steps of:
    forming a plurality of leads on a main surface of a first substrate of mono-crystalline silicon, each lead having a first end and a second end,
    coupling the second end of each lead with a second substrate,
    treating the main surface to control an adhesion of the leads on the main surface, and
    spacing apart the second substrate and the first substrate to extend the leads between the first substrate and the second substrate,
wherein the step of treating the main surface includes:
    forming a set of porous silicon regions extending from the main surface into the first substrate.

2. The process according to claim 1, wherein the step of forming the porous silicon regions includes:
    modulating a porosity of the porous silicon regions to have said porosity decreasing moving away from the main surface.

3. The process according to claim 2, wherein the step of modulating the porosity includes:
    decreasing the porosity from a maximum value in the range 40%-90% to a minimum value in the range 0%-70% with respect to the mono-crystalline silicon.

4. The process according to claim 2, wherein the step of forming the porous silicon regions includes:
    subjecting the wafer to an anodic process with a current density decreasing over time.

5. The process according to claim 4, wherein the step of subjecting the wafer to the anodic process includes:
    decreasing the current density from a starting value to an ending value equal to 5%-20% the starting value.

6. The process according to claim 1, wherein each lead is in contact with a corresponding contact area of the main surface, the step of forming the porous silicon regions including:
    forming the porous silicon regions in at least one selected portion of each contact area.

7. The process according to claim 1, wherein the step of treating the main surface includes:
    decreasing the adhesion moving from the first end to the second end of each lead.

8. The process according to claim 7, wherein the step of decreasing the adhesion includes:
    decreasing the adhesion from a further maximum value to a further minimum value equal to 0.01%-60% the further maximum value.

9. The process according to claim 7, wherein the step of decreasing the adhesion includes:
    reducing a concentration of the porous silicon regions moving from the first end to the second end of each lead.

10. The process according to claim 1, wherein the step of treating the main surface further includes:
    depositing a metal layer on the porous silicon regions.

11. The process according to claim 1, further including the steps of:
    injecting a flowable insulating material between the first substrate and the second substrate, and
    curing the insulating material to obtain an insulating layer embedding the leads.

12. The process according to claim 1, wherein the step of forming the leads includes:
    creating a plurality of grooves on the main surface, the first end of each lead extending in a corresponding groove.

13. The process according to claim 12, wherein the step of forming the leads further includes:
    depositing at least one layer of a hard conductive material in the grooves, and
    depositing at least one layer of a ductile conductive material to complete the leads.

14. The process according to claim 13, wherein the hard conductive material has a hardness higher than 200 Vickers, and wherein the ductile conductive material has a hardness lower than 200 Vickers.

15. The process according to claim 1, further including the step of:
    removing the first substrate.

16. The process according to claim 15, wherein the step of removing the first substrate includes:
    wet etching the first substrate until reaching a stop layer being provided in the first substrate to protect the leads, and
    dry etching a remaining portion of the first substrate.

17. The process according to claim 15, further including the step of:
    removing an external portion of the insulating layer being not protected by the leads.

18. The process according to claim 17, wherein the step of removing the external portion of the insulating layer includes:
    removing the external portion for a depth equal to 0.1%-70% a thickness of the insulating layer.

19. The process according to claim 1, further including the step of:
    removing the second substrate.

20. A process of manufacturing an electronic assembly including a set of interconnected electronic devices, the process including the step of:

coupling each first terminal of at least one first electronic device with the first end and/or each second terminal of at least one second electronic device with the second end of a corresponding lead of the interconnection element manufactured by performing the steps according to claim 1.

21. An electronic assembly including a set of interconnected electronic devices, the electronic assembly being obtained by the process according to claim 20.

22. A process of manufacturing a test card including a plurality of probes for contacting corresponding terminals of electronic devices to be tested, the process including the step of:

coupling a circuitized board with the second ends of the leads of the interconnection element manufactured by performing the steps according to claim 1, the first ends of the leads defining said probes.

23. A test board for testing electronic devices, the test board being obtained by the process according to claim 22.

24. An interconnection element for contacting electronic devices, the interconnection element being obtained by the process according to claim 1.

* * * * *